(12) United States Patent
Riho et al.

(10) Patent No.: US 7,158,433 B2
(45) Date of Patent: Jan. 2, 2007

(54) SEMICONDUCTOR STORAGE DEVICE AND METHOD OF CONTROLLING REFRESHING OF SEMICONDUCTOR STORAGE DEVICE

(75) Inventors: Yoshiro Riho, Tokyo (JP); Yutaka Ito, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 0 days.

(21) Appl. No.: 11/097,247

(22) Filed: Apr. 4, 2005

(65) Prior Publication Data

US 2005/0219890 A1  Oct. 6, 2005

(30) Foreign Application Priority Data

Apr. 5, 2004  (JP)  ............... 2004-110814

(51) Int. Cl.
*G11C 7/00* (2006.01)
(52) U.S. Cl. ............ 365/222; 365/185.25; 365/189.07; 365/230.06
(58) Field of Classification Search ................ 365/222, 365/185.25, 189.07, 230.06
See application file for complete search history.

(56) References Cited

U.S. PATENT DOCUMENTS 5,453,959 A * 9/1995 Sakuta et al. ............... 365/222
6,728,156 B1 * 4/2004 Kilmer et al. ............... 365/222
6,751,144 B1 * 6/2004 Takahashi et al. .......... 365/222

FOREIGN PATENT DOCUMENTS

JP  6-203596 A  7/1994

* cited by examiner

*Primary Examiner*—Richard Elms
*Assistant Examiner*—Toan Le
(74) *Attorney, Agent, or Firm*—Sughrue Mion, PLLC

(57) ABSTRACT

A semiconductor storage device having a memory cell array in which a plurality of memory cells is provided at intersections of a plurality of bit lines and a plurality of word lines and executing refreshing for holding data, including: memory cells for pairing provided on the memory cell array, for compensating for errors of each memory cell; a control circuit for checking a data holding ability of memory cell under test in a predetermined period after power-on; a storage circuit for storing information which specifies the memory cells under test for which it is determined that the data holding ability is low in the checking of the control circuit; and a selecting-line activating circuit for activating circuit for activating a selecting line for pairing corresponding to the memory cells for pairing based on a result of comparing a specific address to be input with the information stored in the storage circuit.

14 Claims, 10 Drawing Sheets

SEMICONDUCTOR STORAGE DEVICE AND METHOD OF CONTROLLING REFRESHING OF SEMICONDUCTOR STORAGE DEVICE

FIELD OF THE INVENTION

The present invention relates to a semiconductor storage device that includes a memory cell array in which a plurality of memory cells is provided at the intersections of a plurality of bit lines and a plurality of word lines, and that are capable of refreshing, such as dynamic random access memories (DRAMs). Particularly, the present invention relates to a semiconductor storage device in which the data retention time of memory cells is extended to allow a longer self-refreshing period so that chip power consumption is reduced, and to a method of controlling refreshing of the semiconductor storage device.

RELATED ART

In a semiconductor storage device such as a DRAM, information is stored in the form of the presence or absence of charges accumulated in capacitors that are used as memory cells. Thus, refreshing is needed to maintain information in the memory cells. DRAMs are usually capable of self-refreshing, i.e., automatically refreshing themselves. Since electric power is consumed each time self-refreshing is performed, power consumption tends to increase in accordance with the recent increase in the capacity of DRAMs.

At the same time, demands for low power consumption have recently become stronger in the fields of mobile applications, such as cellular phones, and DRAMs are no exception. Various approaches for reducing power consumption of DRAMs exist. A major approach among them relates to techniques for reducing power consumption during self-refreshing.

In order to reduce power consumption during self-refreshing, it is effective to simply extend the self-refreshing period so that the number of times of refreshing is to be performed in a unit period is reduced. However, when the self-refreshing period is chosen to be so long as to exceed a period for which memory cells are capable of holding data, data in the memory cells is lost to cause defects. Thus, the self-refreshing period must be chosen appropriately so that data in the memory cells will not be lost.

Now, the process of conventional self-refreshing of a DRAM will be described with reference to a flowchart shown in FIG. 9. A self-refresh mode is set based on a combination of commands input to the DRAM from the outside. When a self-refresh entry is set (step S301), refreshing is started (step S302). The refreshing is controlled based on a row address and a clock defining a period, output from a self-refresh control circuit. The row address is sequentially incremented each time refreshing is performed so that refreshing is performed for each word line. This type of refreshing is referred to as a burst refresh.

When a self-refresh exit is set (step S303), the refreshing is finished. Furthermore, a deep power-down mode can be set so that peripheral circuits of the memory cell array are powered off during a self-refresh period in order to reduce power consumption (step S304). The deep power-down mode is cancelled (step S305) when the following self-refresh entry is set. In the deep power-down mode, bit lines, word lines, and so forth are powered off to weaken electric fields applied to the memory cells so that the data retention time of the memory cells is extended. This allows extending the self-refresh period and thereby reducing power consumption. Although the extended self-refresh period serves to reduce power consumption, when the self-refresh period is extended excessively, data in the memory cells could be lost, causing defects in the DRAM product.

Thus, it is desired that the self-refresh period be extended within such a range that data in the memory cells can be maintained and that self-refreshing be performed for all the memory cells by a specific optimal period.

In practice, however, due to variation that occurs during manufacturing processes or other factors, it is not possible to manufacture DRAMs so that the data retention times of all the memory cells are uniform. Thus, in reality, in order to avoid defects in holding data, self-refreshing is performed by a period with which a certain margin of data retention time is provided. Still in this case, it is not possible to fully prevent some memory cells from losing data (defective memory cells).

Thus, relief measures based on redundancy have been employed. According to such measures, redundant memory cells are provided in advance on a chip, defective memory cells are picked out in a wafer quality test after manufacturing, and the defective memory cells are replaced with redundant memory cells, whereby a non-defective chip is produced.

However, even if the chip is relieved in the wafer quality test by the method described above, defective memory cells could occur when the data retention time of memory cells is extended. That is, as the self-refreshing period is progressively extended in accordance with the data retention time, for example, to 64 ms, 200 ms, and 300 ms, the amounts of charges in the memory cells are reduced, so that defective memory cells tend to occur due to unexpected noise, such as soft error or variation in power supply level.

Generally, defective cells occur only for a small number of bits. Thus, use of an error correcting code (ECC) circuit is an effective countermeasure. The ECC circuit generates parity data from input data, and writes the input data and parity data to memory cells. When the data is read, the ECC circuit performs calculation on the input data and parity data, detecting and correcting data error. Considering circuitry scale and other factors, the ECC circuit can be suitably implemented based on a Hamming code that allows correction of a single bit in a predetermined code length (e.g., refer to Japanese Unexamined Patent Application Publication No. 6-203596).

However, even if the ECC circuit is used, sufficient scale of error correction is not achieved, and the self-refreshing period cannot be extended sufficiently. Thus, it has been possible to extend the self-refreshing period only insufficiently, for example, from approximately 100 ms to 400 ms.

FIG. 10 is a graph showing the self-refreshing period and the amount of consumption current needed for self-refreshing. As will be understood from FIG. 10, the amount of consumption current (Icc6) is reduced as the self-refreshing period (tREF) is extended. Thus, when the self-refreshing period is extended from approximately 100 ms to 400 ms as described above by the use of the ECC circuit, the amount of consumption current is reduced by approximately 260 μA. Furthermore, since convergence starts when the self-refreshing period is approximately 1 second in the graph shown in FIG. 10, practically, it is reasonable to design a DRAM in which defects do not occur with a self-refreshing period of approximately 1 second.

SUMMARY OF THE INVENTION

It is an object of the present invention to provide a semiconductor storage device that allows further extending the self-refreshing period without using complex circuit configuration or increasing chip size.

A semiconductor storage device according to an aspect of the present invention includes a memory cell array in which a plurality of memory cells is provided at intersections of a plurality of bit lines and a plurality of word lines and executing refreshing for holding data, comprising: memory cells for pairing provided on said memory cell array, for compensating for errors of each memory cell; a control circuit for checking a data holding ability of memory cell under test in a predetermined period after power-on; a storage circuit for storing information which specifies said memory cells under test for which it is determined that said data holding ability is low in the checking of said control circuit; and a selecting-line activating circuit for activating circuit for activating a selecting line for pairing corresponding to said memory cells for pairing based on a result of comparing a specific address to be input with the information stored in said storage circuit.

The phrase "for pairing" herein refers to the use for assisting holding of data by storing data that is accessed from the outside in dedicated memory cells for data storage separately from real memory cells where the data is supposed to be stored. Hereinafter, "memory cells for pairing", "selecting lines for pairing" "column selecting lines for pairing" and "row selecting lines for pairing" are used as component names including "for pairing".

In the semiconductor storage device according to the aspect of the present invention, said storage circuit stores respective bits of an address of said memory cell under test for which it is determined that said data holding ability is low in the checking by said control circuit, and said selecting-line activating circuit compares said respective bits with the corresponding bits of an input address, and activates said selecting line for pairing when all bits match while does not activate said selecting line for pairing when all bits do not match.

In the semiconductor storage device according to the aspect of the present invention, said storage circuit stores information indicating whether said memory cell for pairing is needed, and said selecting-line activating circuit activates said selecting line for pairing when said information indicates that said memory cell for pairing is needed while does not activate said selecting line for pairing when said information indicates that said memory cell for pairing is not needed.

In the semiconductor storage device according to the aspect of the present invention, said selecting-line activating circuit is configured to activate a column selecting line for pairing, and an OR circuit that takes the logical sum of data in two memory cells and outputs a single piece of data when said column selecting line for pairing and corresponding column selecting line are activated by said selecting-line activating circuit is provided.

In the semiconductor storage device according to the aspect of the present invention, said selecting-line activating circuit is configured to activate a row selecting line.

The semiconductor storage device according to the aspect of the present invention further comprises an error correcting circuit including an encoder and a decoder.

In the semiconductor storage device according to the aspect of the present invention, said predetermined period is a period before the first entry to a self-refresh mode after power-on.

In the semiconductor storage device according to the aspect of the present invention, said predetermined period is an initializing period after power-on.

In the semiconductor storage device according to the aspect of the present invention, said memory cell array includes dummy cells for holding data of said memory cells under test on a word-line basis, and said control circuit checks said data holding abilities after copying data in said memory cells under test to said dummy cells, stores the test results in said storage circuit, and copies data in said dummy cells back to said memory cells under test.

A method of controlling self-refreshing semiconductor storage device according to an aspect of the present invention comprises checking data holding abilities of memory cells under test in a predetermined period after power-on, storing information specifying said memory cells under test for which it is determined that said data holding ability is low, and in executing self-refreshing for holding data, comparing an input specific address with said stored information, activating a selecting line for pairing corresponding to comparing results so that memory cells for pairing provided on said memory cell array are selected.

In the method of controlling self-refreshing of a semiconductor storage device according to the aspect of the present invention, said checking of said data holding abilities, comprising: copying data in said memory cells under test to dummy cells, self-refreshing said dummy cells, self-refreshing said memory cells under test, and copying data in said dummy cells back to said memory cells under test after said data holding abilities is checked.

In the method of controlling self-refreshing of a semiconductor storage device according to the aspect of the present invention, said dummy cells are self-refreshed by a period that has a sufficient margin with respect to said data holding abilities, and said memory cells under test are self-refreshed by a period that is longer than said self-refreshing period of said dummy cells.

In the method of controlling self-refreshing of a semiconductor storage device according to the aspect of the present invention, said self-refreshing period of said dummy cells is approximately 100 ms, and said self-refreshing period of said memory cells under test is approximately 1 second.

According to the present invention, it is possible to extend the self-refreshing period, serving to reduce power consumption of a chip. Furthermore, even when unexpected noise occurs after the assembly of a memory product, defects due to data loss or the like caused by the noise can be avoided.

DETAILED DESCRIPTION OF THE INVENTION

Now, preferred embodiments of the present invention will be described with reference to the drawings.

Figure 1:
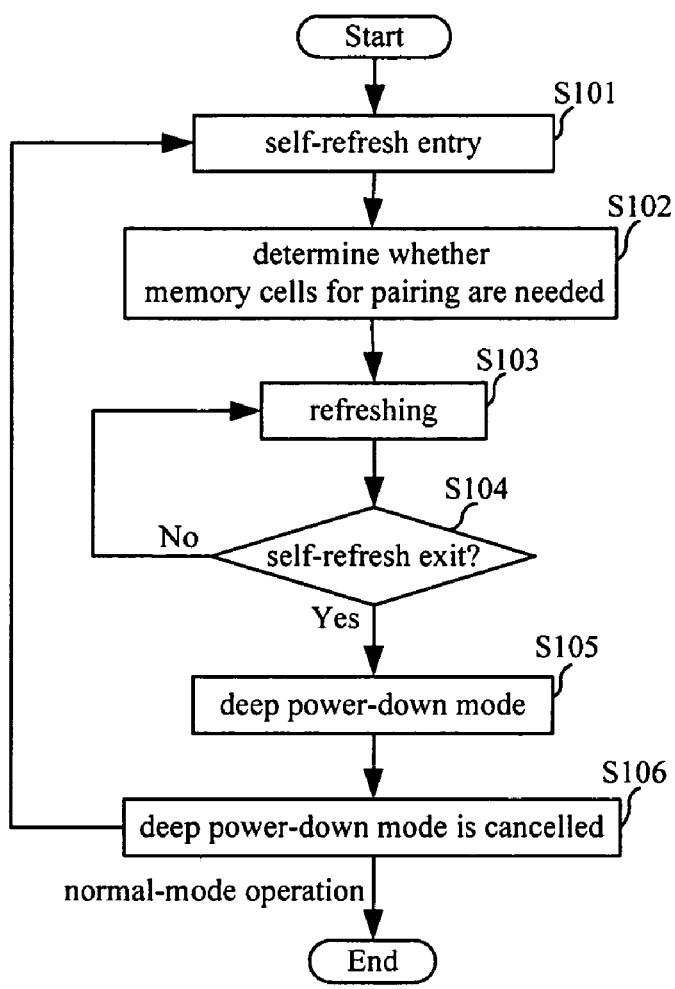
FIG. 1 is a flowchart showing the overall process of self-refreshing in a semiconductor storage device according to an embodiment of the present invention.

FIG. 1 is a flowchart showing the overall process of self-refreshing in a semiconductor storage device according to an embodiment of the present invention. In a DRAM, a self-refresh mode in which self-refreshing is performed is set based on a combination of commands input from the outside. First, when the first self-refresh entry after power-on is set (step S101), it is determined whether memory cells for pairing are needed (step S102). Step S102 is a feature of this embodiment, and will be described later in detail.

Then, refreshing is started (step S103). The row address is sequentially incremented each time refreshing is performed so that refreshing is performed for each word line (burst refresh). When a self-refresh exit is set (step S104), the refreshing is finished. Furthermore, the above-described deep power-down mode can be set (step S105). Then, the deep power-down mode is cancelled (step S106) when the following self-refresh entry is set.

Figure 2:
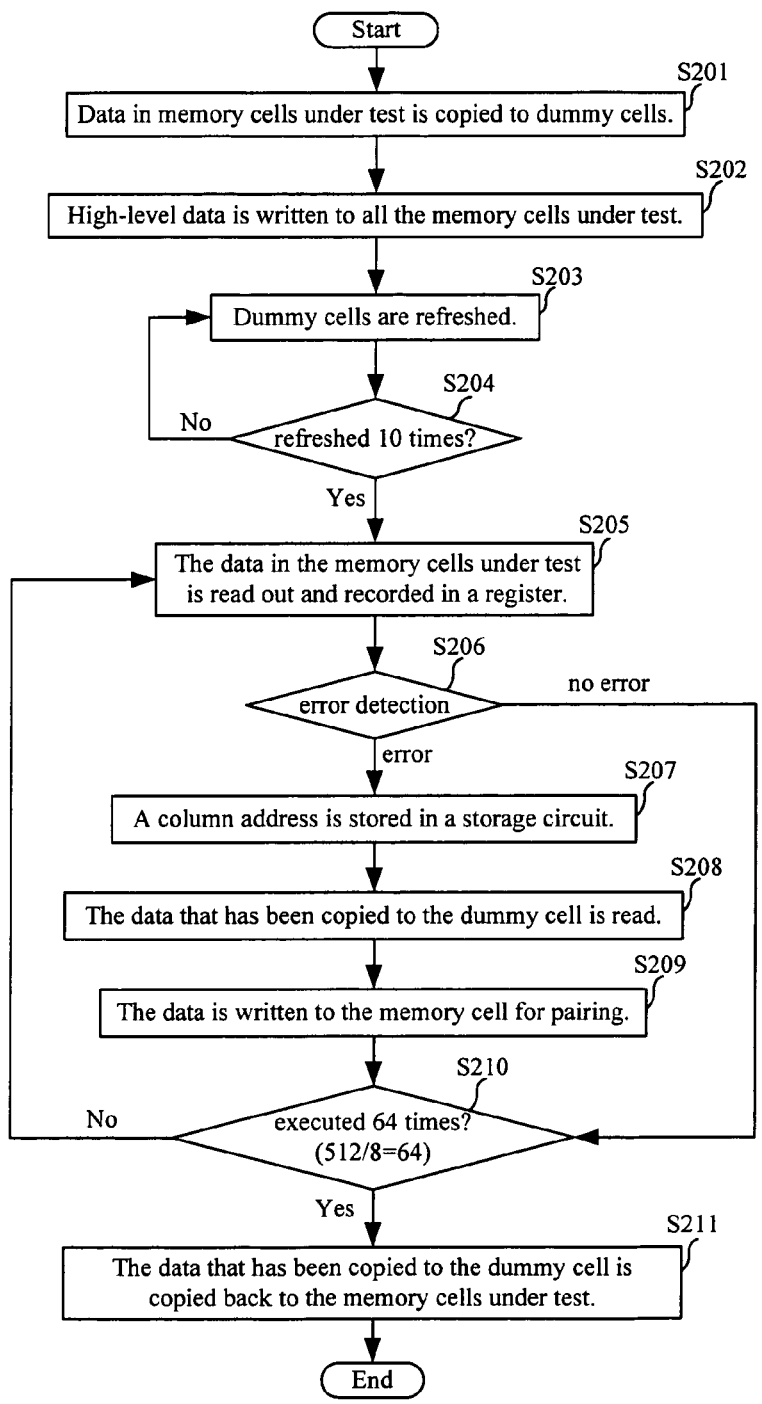
FIG. 2 is a flowchart of a specific process executed in step S102.

FIG. 2 is a flowchart of a specific process executed in step S102. The process shown in FIG. 2 relates to a method of selecting a column selecting line corresponding to a column address or a column selecting line corresponding to a column address and a column selecting line for pairing after the first self-refresh entry after power-on. By executing the process shown in FIG. 2 in an actual operation after power-on, it is possible to appropriately deal with error that occurs after the product is manufactured, which has been difficult to deal with by the conventional redundant memory cells. The process shown in FIG. 2 will be described below in order of steps.

First, in step S201, after a self-refresh entry is set, data in a plurality of memory cells that is subject to self-refreshing and accessed via a single word line (hereinafter referred to as memory cells under test) is copied to dummy cells. That is, in order to save data stored in the memory cells during a normal-mode operation, the data is copied to the dummy cells.

More specifically, a word line that is relevant to self-refreshing is activated, and data in memory cells under test are respectively output to bit lines and amplified by sense amps. Then, a word line for accessing dummy cells connected to the bit lines is activated, and the data output to the bit lines is stored in the dummy cells. By the procedure described above, data in the memory cells under test can be copied to the dummy cells.

Then, in step S202, data that causes memory cells to physically have charges (high-level data) is written to all the memory cells under test. Steps S202 is a preparation for carrying out a test as to whether the charges can be held for a target time in subsequent steps. Since an ECC circuit is used, parity data is also written in a similar manner.

In step S203, the dummy cells are refreshed. Since the data held in the memory cells under test during a normal-mode operation is stored in the dummy cells, it is to be ensured that the data be held. Thus, the refreshing period for the dummy cells must be chosen so as to have a sufficient margin with respect to the data holding ability of the memory cells. For example, in this embodiment, the refreshing period for the dummy cells is chosen to be 100 ms. In practice, however, the refreshing period is not limited to this specific value.

In step S204, it is determined whether the dummy cells have been refreshed ten times. When the dummy cells have been refreshed ten times (when step S204 turns out "Yes"), the process proceeds to step S205.

Then, in step S205, the data in the memory cells under test, to which high-level data has been written, is read out and recorded in a register. The number of times of refreshing used in step S204 is chosen to be ten herein since the target data retention time is chosen to be 1 second. Actually, however, the target time is not limited to 1 second, and the number of times of refreshing used in step S204 can be changed in accordance with the target time.

When it is determined in step S204 that the dummy cells have not been refreshed ten times (when step S204 turns out "No"), refreshing in step S203 is repeated until the number of times of refreshing reaches ten.

Then, in step S206, the data read from the memory cells under test, which is supposed to be at the high level, is input to a NAND circuit to detect error. In this embodiment, a 12-input NAND circuit is used so that a total of 12 bits including 8-bit normal data and 4-bit parity data can be checked. This allows checking as to whether the memory cells under test have the ability of holding data for 1 second.

When all the outputs of the NAND circuit with regard to a single word line are at the low level, it is determined that no error has occurred (Step S206 turns out "No error"). Then, through step S210, in step S211, the data that has been copied to the dummy cells is copied back to the memory cells under test, restoring the state in the normal mode. The procedure of copying in this case is the same as that in the case of copying the data in the memory cells under test.

On the other hand, when an output of the NAND circuit is at the high level, it is determined that an error has occurred (step S206 turns out "Error"). Then, a column address for accessing the memory cell in which the error has occurred is stored in a storage circuit (step S207). The storage circuit is implemented by a random access memory (RAM).

The column address stored in the storage circuit is compared with a column address input to a column-selecting-line activating circuit. When these addresses match, a column selecting line corresponding to the input column address and a column selecting line for pairing that specifies a memory cell for pairing are activated. When the column addresses do not match, only the column selecting line corresponding to the input column address is activated. Accordingly, when an input address specifies a memory cell whose data retention time is short and from which data including an error is read, a memory cell for pairing is accessed as well as the memory cell corresponding to the input column address.

Then, the data that has been copied to the relevant dummy cell is read (step S208), and written to the memory cell for pairing (step S209).

In step S210, it is determined whether the checking process in steps S205 to S209 has been executed 64 times. That is, since the checking process is executed on a word line-basis, assuming that memory cells for 512 bits are accessed via each word line, with 8 bits of normal data processed in a single iteration of the process, the checking process is executed 64 times in total. When the process is finished for a single word line (when step S210 turns out "Yes"), the data that has been copied to the dummy cells is copied back to the memory cells under test (step S211), whereby the state in the normal mode is restored.

By executing the above-described steps in order, when accessing a memory cell that does not satisfy the target data retention time and from which data including an error is read, a memory cell for pairing, storing the same data as the memory cell, is accessed. Thus, an error that is caused by performing self-refreshing by a long period can be avoided. In this case, by using an ECC circuit in addition to executing the process described above, the self-refreshing period can be further extended.

The memory cells for pairing, similarly to the dummy cells, need to hold data reliably, so that the self-refreshing period must be chosen to have a sufficient margin with respect to the data holding ability of the memory cells. With the memory cells for pairing, it is possible to compensate for an error that occurs in memory cells under test when self-refreshing is performed by a long period.

Figure 3:
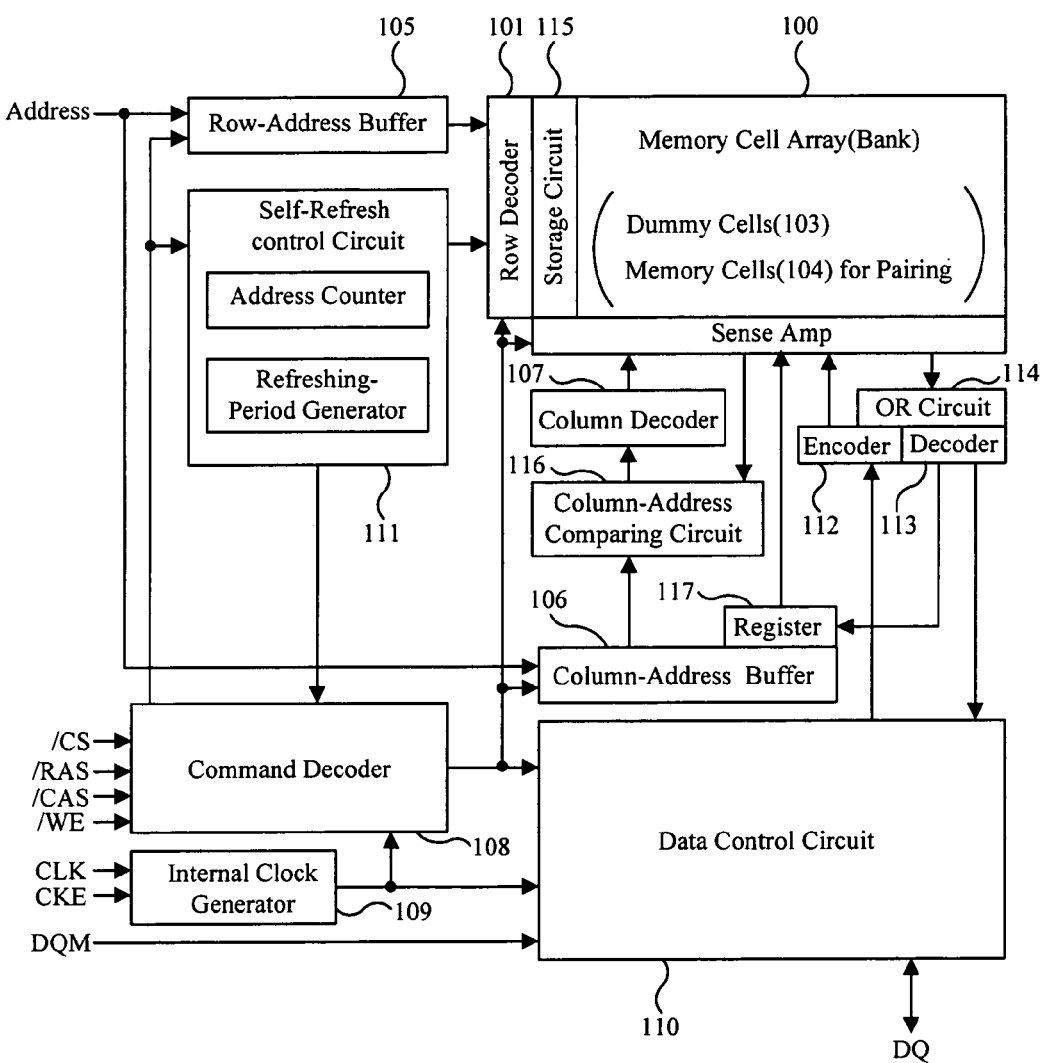
FIG. 3 is a diagram showing a specific construction for implementing the processes shown in FIGS. 1 and 2.

FIG. 3 is a diagram showing a specific construction for implementing the processes shown in FIGS. 1 and 2. In the construction shown in FIG. 3, the embodiment is applied to a clock-synchronous DRAM. In FIG. 3, notations such as ×8 and ×12 denote the number of bits of signals.

The DRAM shown in FIG. 3 includes a bank implemented by a memory cell array 100 having memory cells at the intersections of bit lines and word lines, a row decoder 101 including a word driver that decodes a row address and drives a word line, and sense amps 102 connected to the bit lines of the memory cell array 100. The memory cell array 100 includes dummy cells 103 for copying data in memory cells under test of data holding ability, and memory cells 104 for pairing that are used to compensate for data in memory cells that have short data retention times according to the results of the testing.

Furthermore, the DRAM shown in FIG. 3 includes a row-address buffer 105 to which a row address is input, a column-address buffer 106 to which a column address is input, a column decoder 107, a command decoder 108 that outputs command signals for controlling the operations of components of the DRAM, an internal clock generator 109 that generates a clock for synchronizing signals within the chip, a data control circuit 110 that controls input of data from the outside and output of data to the outside, and a self-refresh control circuit 111 that controls the address and period of self-refreshing.

The self-refresh control circuit 111 includes an address counter that specifies a row address of a row relevant to refreshing, and a refreshing-period generator. The refreshing-period generator may include a temperature compensator that sets a refreshing period with consideration of temperature characteristics.

Furthermore, the DRAM shown in FIG. 3 includes an encoder 112 that adds check bits to input data, a decoder 113 that decodes encoded output data and detects error, and OR circuit 114 that take the logical sum when outputs from a memory cell and a memory cell 104 for pairing are received in relation to input of a single address. The encoder 112 and the decoder 113 constitute an ECC circuit.

Furthermore, the DRAM shown in FIG. 3 includes a register 117 that holds a column address when an error is detected by the ECC circuit, a storage circuit 115 that stores data in the register 117, and a column-address comparing circuit 116 that accesses the storage circuit 115 and activates a column selecting line and a column selecting line for pairing.

Command control signals that are input to the DRAM include a chip select signal /CS, a row-address strobe signal /RAS, a column-address strobe signal /CAS, and a write enable signal /WE. The operations of the components are controlled according to these command control signals.

Furthermore, the DRAM shown in FIG. 3 receives an external clock signal CLK for synchronization, and a clock enable signal CKE that determines whether the external clock signal CLK is effective. When the clock enable signal CKE is at the low level, the external clock signal CLK is not effective, so that the DRAM enters a standby state. The DRAM is configured to allow input and output of input/output data DQ that is used for writing to or reading from the memory cell array and an input/output mask signal DQM for masking the input/output data DQ.

Now, the construction shown in FIG. 3 will be described in the context of the process shown in FIG. 2. First, a command control signal for a self-refresh entry is input to the DRAM, the clock enable signal CKE at the low level is input and held, whereby a self-refresh entry is executed. Then, the self-refresh control circuit 111 generates a self-refreshing period and a row address, and outputs the self-refreshing period and the row address to the row decoder 101. The word driver (not shown) selectively drives a word line based on the row address input to the row decoder 101, whereby data on all the memory cells under test, accessed via the word line, are output to the bit lines.

Then, the data output to the bit lines is amplified by the sense amps 102. Then, the self-refresh control circuit 111 similarly outputs a row address of the dummy cells 103 to the row decoder 101. The dummy cells 103 are similarly accessed so that the amplified data associated with the respective bit lines is written to the dummy cells 103. Thus, the data in the memory cells under test is copied to the dummy cells.

After the data is copied to the dummy cells, a word line for accessing the memory cells under test is activated so that high-level data is written to all the memory cells under test.

Then, the self-refresh control circuit 111 refreshes the dummy cells 103 by a period that has a sufficient margin with respect to the data holding ability of the memory cells. In this embodiment, the refreshing period is chosen to be, for example, 100 ms. As for the memory cells under test, the refreshing period is chosen to be longer. In this embodiment, the refreshing period is chosen to be, for example, 1 second. Thus, it is possible to test the data holding ability of the memory cells under test while allowing the dummy cells 103 to reliably hold the data stored in the memory cells during a normal-mode operation.

Then, after 1 second elapses, the data in the memory cells under test is output to the bit lines by units of 12 bits (12 bits in total including 8 bits of normal data and 4 bits of parity data as described earlier) and amplified by the sense amps 102, and the amplified data is output to data input/output lines (not shown). Furthermore, the data output to the input/output lines is input to a NAND circuit (not shown) to perform error checking. Since all the bits of the data are supposed to be at the high level, it is determined that no error has occurred when the output of the NAND circuit is low-level data, while it is determined that an error has occurred when the output of the NAND circuit is high-level data.

When it is determined that an error has occurred, a column address associated with the error is stored in the storage circuit 115 via the column-address buffer 106. When it is determined that no error has occurred, no column address is written.

The column address stored in the storage circuit 115, when a matching column address is input to the column-address comparing circuit 116, causes a column selecting line for pairing to be activated as well as a column selecting line specified by the column address.

Then, the data in the dummy cells 103 stored during the normal-mode operation is copied back to the memory cells under test. The operation is the reverse of the operation of copying data to the dummy cells 103, in which the data in the memory cells under test is amplified by the sense amps 102 and the dummy cells 103 are accessed to write the amplified data. That is, the data in the dummy cells 103 is amplified by the sense amps 102, and the memory cells under test are accessed to write the amplified data. At this time, based on the column address stored in the storage circuit 115, data in a relevant dummy cell 103 is written to a corresponding memory cell 104 for pairing. This allows compensating for data in a memory cell for which it is determined that the data retention time is short.

Through the process described above, the data in the memory cells under test is restored to the state in the normal mode. Furthermore, for memory cells with short data retention times, memory cells 104 for pairing are provided for compensation, and the same data as in the memory cells with short data retention times is written thereto. The first self-refreshing after the DRAM is powered on is performed based on the construction and operation described above.

Next, writing of data from the outside will be described with reference to FIG. 3. External data is input as input/output data DQ, and is controlled by the data control circuit 110. Since an ECC circuit is used in this embodiment, the input data is input to the encoder 112 so that encoded data with parity data is output. The encoded data is finally written to memory cells in the memory cell array 100 corresponding to column addresses and row addresses specified by the column decoder 107 and the row decoder 101. When it is determined by the column-address comparing circuit that a column address fed from the column-address buffer 106 matches a column address stored in the storage circuit 115, the column decoder 107 activates a column selecting line for selecting a memory cell 104 for pairing as well as a column selecting line corresponding to the column address. Thus, the single piece of external data can also be stored in the memory cell 104 for pairing.

Next, reading of data from the DRAM will be described with reference to FIG. 3. The same operation applies to a case of reading data to the outside up to specifying a memory cell. Furthermore, when it is determined by the column-address comparing circuit 116 that an input column address matches a column address stored in the storage circuit 115, a column selecting line and a column selecting line for pairing are activated similarly to the case of writing, so that the data stored is output to the corresponding memory cell and memory cell 104 for pairing. The two pieces of output data are amplified by the sense amps 102, and the relevant OR circuit 114 takes the logical sum to produce a single piece of output data, which is output to the outside from the DQ pad via the data control circuit 110.

The OR circuit 114 are used as described above considering only cases where erroneous low-level data is output when data is supposed to be at the high level. This is because it is practically sufficient to consider only cases where data is lost due to high-level data changing to low-level data as far as errors attributable to an extended self-refreshing period is concerned.

As for the memory cells 104 for pairing, since the self-refreshing period is chosen to be sufficiently short, problems do not particularly arise for holding data. Thus, even when data in a memory cell is lost due to an extended self-refreshing period, a defect in holding data can be effectively prevented by taking the logical sum with data in a corresponding memory cell 104 for pairing.

In the construction and operation described above, by detecting memory cells with short data retention times and providing memory cells 104 for pairing that compensate for the memory cells, it is possible to extend the self-refreshing period while preventing defects in holding data.

Next, as important elements for carrying out the embodiment of the present invention, the operation of the memory cells 104 for pairing, the column-address comparing circuit 116, and the OR circuit 114 will be described in detail with reference to the drawings.

Figure 4:
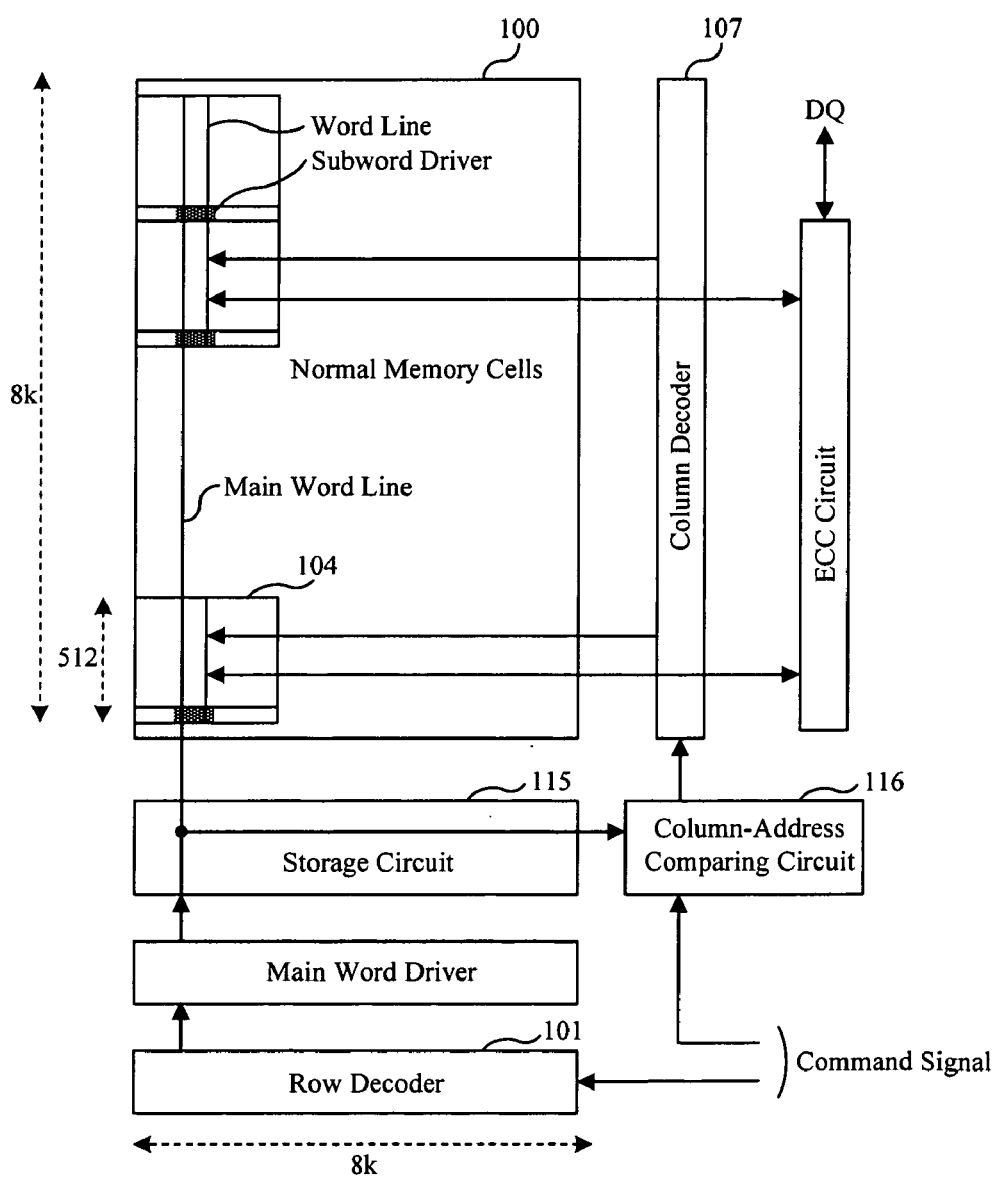
FIG. 4 is an enlarged view showing the memory cells for pairing and peripheral circuits shown in FIG. 3.

First, a reading operation and a writing operation involving the memory cells 104 for pairing will be described with reference to FIG. 4. FIG. 4 is an enlarged view showing the memory cells 104 for pairing and peripheral circuits shown in FIG. 3.

The reading operation and the writing operation are controlled according to command signals output from the command decoder 108 (FIG. 3). The command signals are input to the row decoder 101 and the column-address comparing circuit 116, activating the row decoder 101 and the column-address comparing circuit 116. Then, upon receiving input of an address signal, a main word line corresponding to the row address is selectively driven by a main word driver and activates a subword driver in the memory cell array 100 to selectively drive a word line, whereby memory cells are accessed. At this time, since the main word line is commonly connected to memory cells 104 for pairing, the memory cells 104 for pairing are also accessed.

The column address comparing circuit 116 receives input of a column address, and upon receiving a command signal, compares the input column address with a column address stored in the storage circuit 115. When these column addresses match, a column selecting line specifying a memory cell 104 for pairing as well as a column selecting line corresponding to the column address is activated. These two column selecting lines allow simultaneously reading data or writing data from two memory cells.

Figure 5:
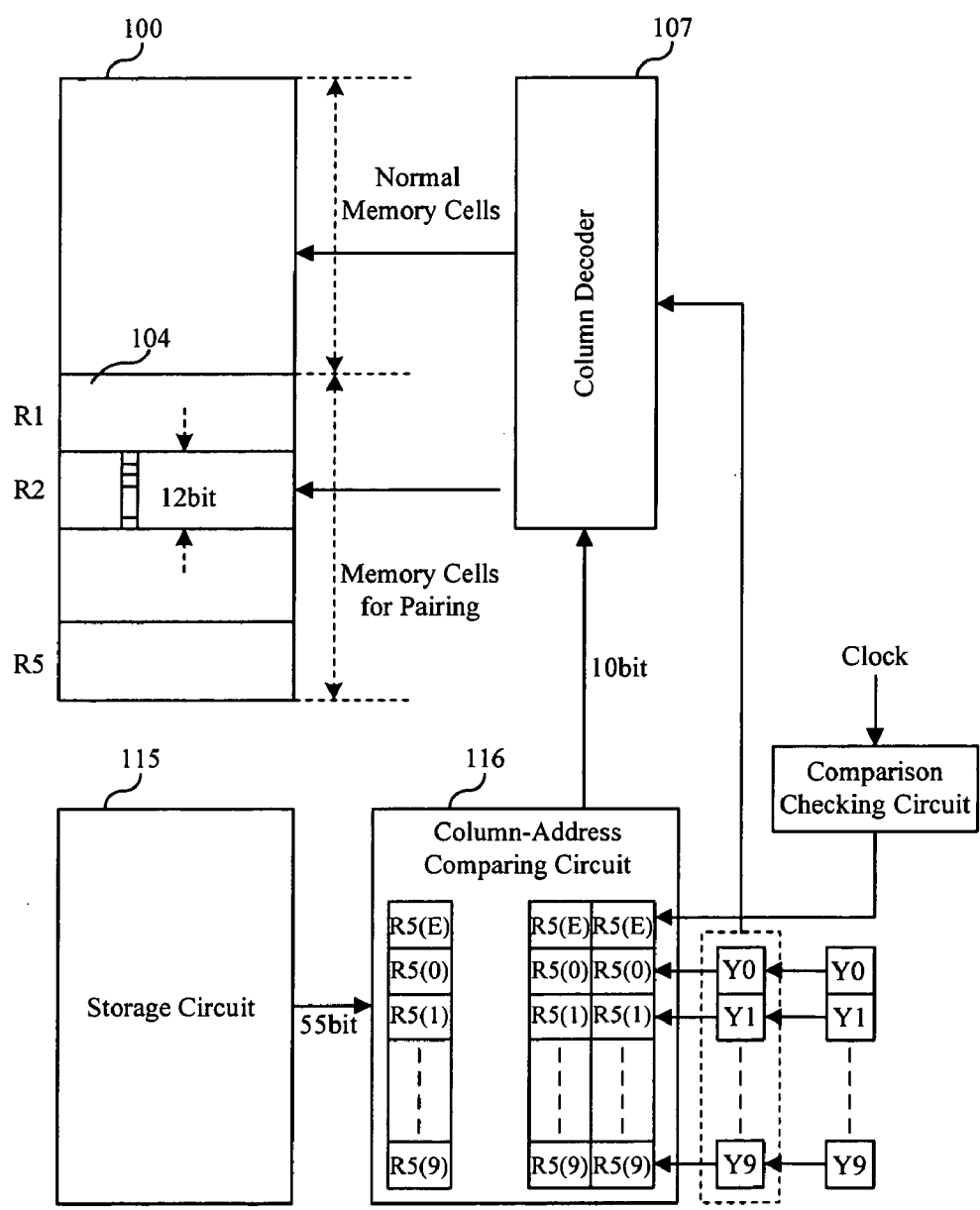
FIG. 5 is an enlarged view showing the column-address comparing circuit and peripheral circuits shown in FIG. 3.

Next, the operation of the column-address comparing circuit 116 will be described with reference to FIG. 5. FIG. 5 is an enlarged view showing the column-address comparing circuit 116 and peripheral circuits shown in FIG. 3.

The column-address comparing circuit 116 compares the input column address with the column address stored in the storage circuit 115. When these column addresses match, the column-address comparing circuit 116 causes a column selecting line specifying a memory cell 104 for pairing as well as a column selecting line corresponding to the column address to be activated. In a specific example shown in FIG. 5, the number of memory cells 104 for pairing per main word is 60 bits consisting of 5 sets of 12 bits including 8 normal bits and 4 parity bits. In this example, it is possible to compensate for five memory cells for which it is determined that the data retention time is short. The number of bits of the memory cells 104 for pairing is not limited to the specific number given above. However, 60 bits is sufficient in consideration of experiment results indicating that the number of memory cells with short data retention times is very small. Furthermore, since chip size increases when a large number of memory cells 104 for pairing is provided, the number should desirably be minimized.

As shown in FIG. 5, in this embodiment, a column address is represented by 10 bits Y0 to Y9, and one bit indicating the state of storage in the storage circuit 115 is attached thereto. Since 5 sets of these 11 bits are prepared, 55 bits of data in total are transferred from the storage circuit 115 to the column-address comparing circuit 116. When memory cells 104 for pairing are assigned, high-level data is written to registers R1(E) to R5(E) of the column-address comparing circuit 116.

In a reading operation or a writing operation, first, a register R(E) is checked by a comparison checking circuit, and a column address represented by the bits Y0 to Y9 is compared with an input column address only when high-level data is detected. When these column addresses match, 10 bits other than the bit in the register R(E) is output as a column address of a memory cell 104 for pairing, and the column decoder 107 activates a column selecting line for pairing that specifies the memory cell 104 for pairing. At this time, the column decoder 107 also activates a column selecting line corresponding to the real column address. Thus, two memory cells can be accessed simultaneously.

Figure 6:
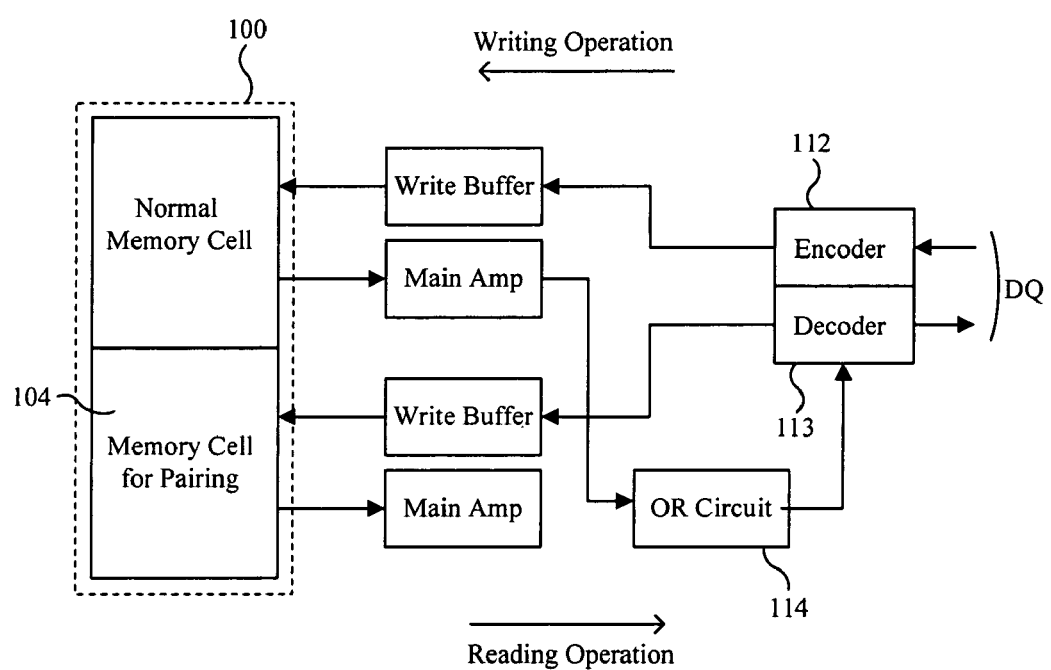
FIG. 6 is an enlarged view showing the OR circuit and peripheral circuits shown in FIG. 3.

Next, the operation of the OR circuit 114 will be described with reference to FIG. 6. FIG. 6 is an enlarged view showing the OR circuit 114 and peripheral circuits shown in FIG. 3.

Referring to FIG. 6, the encoder 112 attaches parity data to data input as input/output data DQ, and the resulting data is stored in memory cells in the memory cell array via a write buffer. For example, when the input data has 8 bits, the parity data has 4 bits. As described earlier, when a specific column address is involved, the same data is stored in corresponding memory cells 104 for pairing.

When reading involves the specific column address, two pieces of data are output simultaneously. The pieces of data are integrated into a single piece of data by the relevant OR circuit 114. More specifically, the OR circuit 114 are provided respectively in association with the 12 bits. The encoder 112 and the decoder 113 are constructed the same as those in known ECC circuits.

Figure 7:
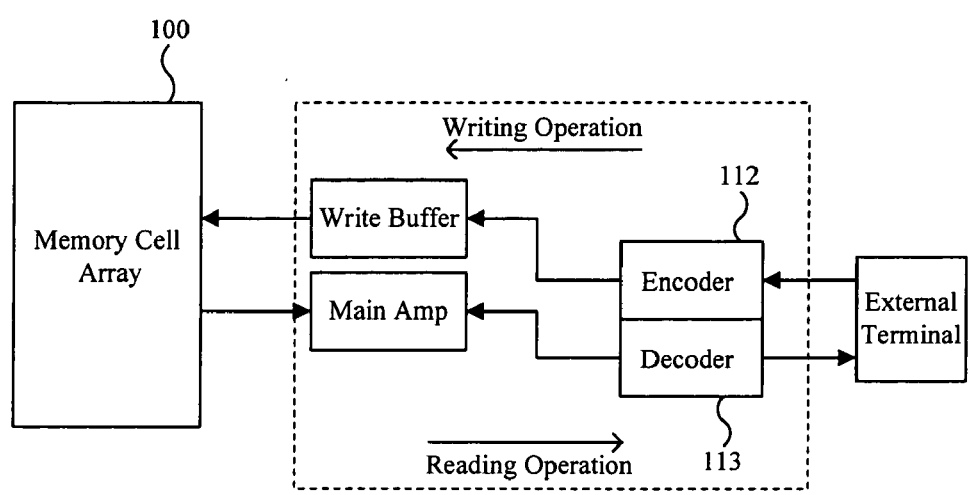
FIG. 7 is a schematic diagram of an ECC circuit.

Now, an ordinary ECC circuit will be described. FIG. 7 is a schematic diagram of an ECC circuit. The ECC circuit shown in FIG. 7 includes an encoder that encodes input data from an external terminal by generating parity data, a write buffer that writes the encoded input data and parity data to memory cells, main amps that amplify the encoded data read from the memory cells, and a decoder that decodes the amplified encoded data and that corrects error if any and outputs corrected data.

The number of parity bits needed in an ECC circuit is determined in accordance with input data based on a known inequality regarding Hamming codes:

$$2^k \geq m+k+1 \quad (1)$$

where m denotes the number of bits of input/output data, and k denotes the number of parity bits. According to expression (1), when m=8, i.e., the minimum unit of input/output data, the minimum number of parity bits needed is k=4. Thus, when implementing ECC, four or more parity bits are needed for eight bits of input/output data.

Next, row selecting lines for pairing will be described. The operation relating to column addresses has been described earlier with reference to FIG. 2. The operation for selecting row selecting lines for pairing can be explained by replacing column addresses in FIG. 2 with row addresses. However, row selecting lines for actually accessing memory cells are word lines, so that storage circuit 115 for determining whether a row selecting line for pairing is needed should be associated with selection by subword drivers.

Since all row address for selecting normal memory cells by the subword driver have already been decoded, as opposed to the case of column addresses, it is not needed to store the respective bits in a storage circuit 115 and compares the bits with the corresponding bits of an input address. In this case, information indicating whether a row selecting line for pairing is needed for a selected word line and which row selecting line for pairing is to be used suffices. Although this differs from the case of column selecting lines, similar circuit configuration is also possible for the column side. Furthermore, the row side may also be configured so that a row address is stored in a storage circuit 115. These configurations can be selectively employed in design.

Figure 8:
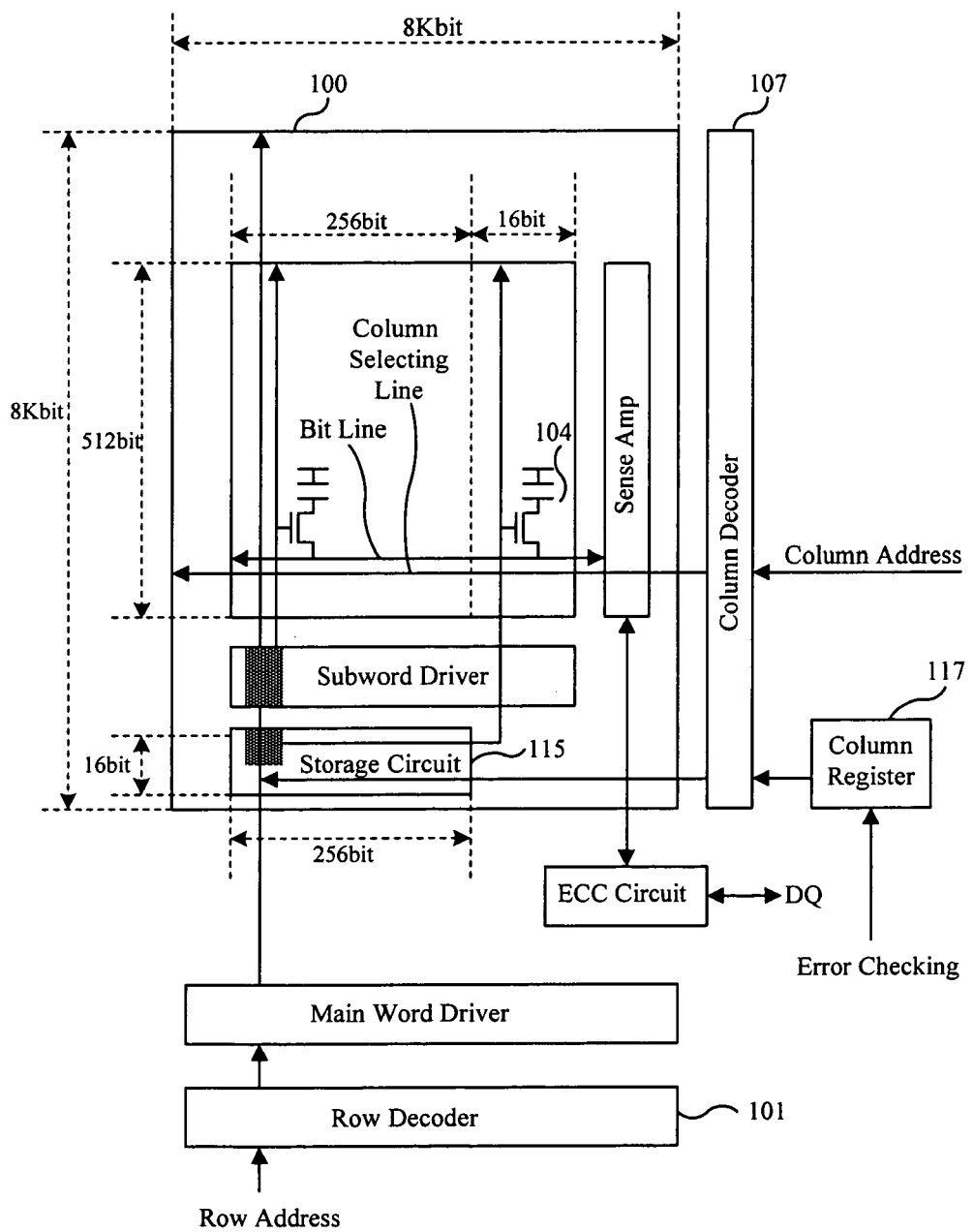
FIG. 8 is an enlarged view of circuits in the periphery of the memory cell array in a case where a row selecting line for pairing is used in this embodiment.
Figure 9:
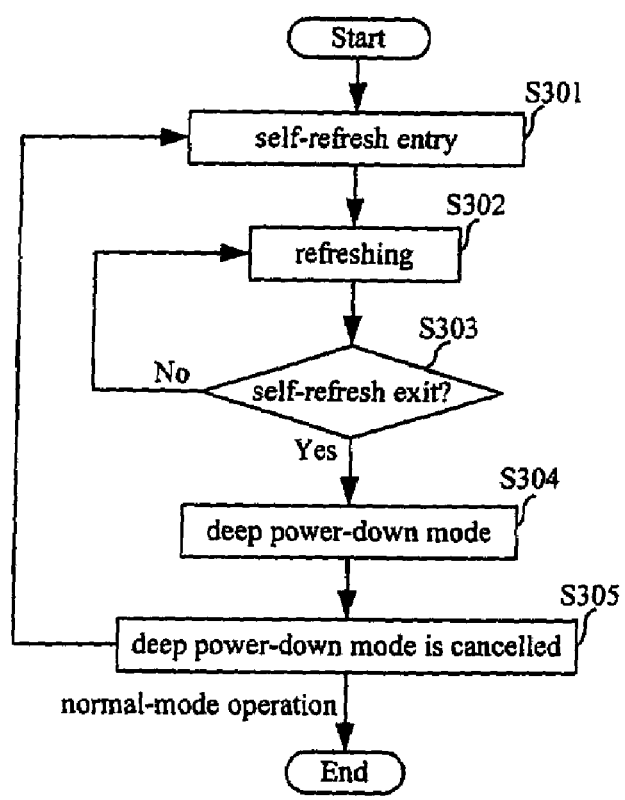
FIG. 9 is a flowchart showing the process of conventional self-refreshing of a DRAM.
Figure 10:
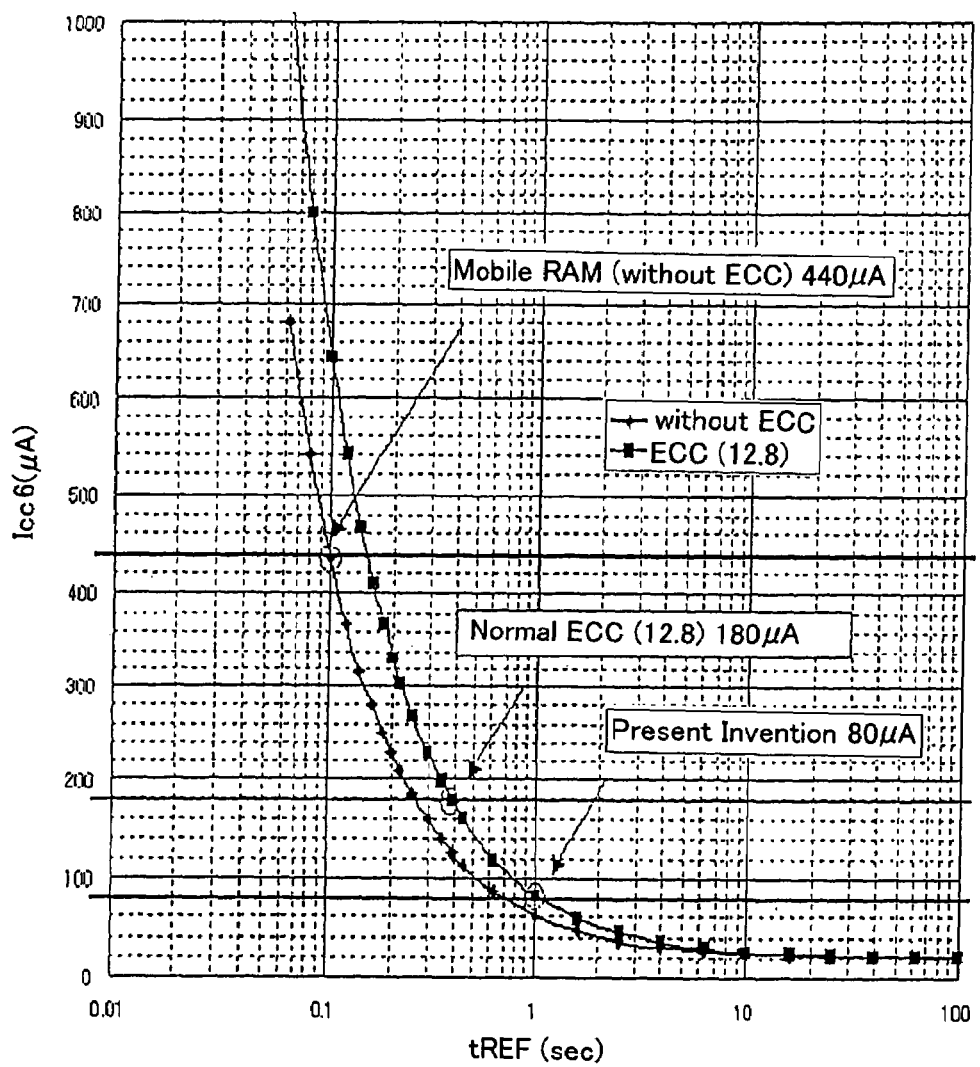
FIG. 10 is a graph showing the self-refreshing period and the amount of consumption current needed for self-refreshing.

FIG. 8 is an enlarged view of circuits in the periphery of the memory cell array in a case where a row selecting line for pairing is used in this embodiment. Basically, when a memory cell 104 for pairing is used, a word line for a normal memory cell and a word line for a memory cell 104 for pairing are selected simultaneously so that data in these memory cells are combined on a bit line for reading. In the example shown in FIG. 8, the dummy cells 103 and the memory cells 104 for pairing are implemented by common memory cells. That is, the memory cells are used as the dummy cells 103 during testing of data holding ability and as the memory cells 104 for pairing thereafter.

In the configuration described above, however, as opposed to the example of column selecting lines, data cannot be copied to the memory cells 104 for pairing during testing of data holding ability. Thus, data in memory cells with low data holding ability is copied to the memory cells 104 for pairing after the testing is finished. In this case, a row selecting line for pairing associated with the copying destination must be activated at a timing later than that for a word line associated with the copying source. Therefore, in order to prevent data loss, a delaying circuit or the like must be provided on the side of the row selecting line for pairing. The method of error checking is the same as that in the case of column selecting lines, so that description thereof will be omitted.

In FIG. 8, the result of error checking is written to the relevant storage circuit 115 according to a column address specified by the column register 117. The storage circuits 115 are provided for the respective subword drivers, and pieces of information representing whether a row selecting line for pairing is to be used and which row selecting line for pairing is to be accessed are stored in the respective storage circuits 115. For example, storage circuits 115 for 16 bits are allocated in one-to-one association with the respective word lines for 16 bits.

Since the storage circuits 115 are attached to the subword drivers, when a row address for selecting a word line is input, the relevant storage circuit 115 is accessed at the same time, and a row selecting line for pairing as well as a word line is activated based on the data stored in the storage circuit 115. Thus, for each column selecting line, it is possible to access two memory cells simultaneously. As opposed to the case of column selecting lines for pairing in which two pieces of data are output by two column selecting lines, when row selecting lines for pairing are used, two pieces of data are output by a single column selecting line. In this configuration, the two pieces of output data are combined by a common bit line, so that the OR circuit 114 shown in FIG. 3 are not needed.

Since the row selecting lines for pairing are activated on a word-line basis, memory cells 104 for pairing are selected for memory cells with sufficient data holding ability as well as memory cells with low data holding ability. In the case of the memory cells with sufficient data holding ability, data is not inverted. In this case, since a small voltage is increased by the common bit line (simply considered, the voltage is doubled since two memory cells are involved), additional advantage of improvement in sensing time or sensing margin of the sense amps is achieved.

Although the constructions and operations of the embodiments of the present invention have been described above, the present invention is not limited to the embodiments, and it covers various modes including alternatives and modifications readily conceived by those skilled in the art.

The invention claimed is:

1. A semiconductor storage device having a memory cell array in which a plurality of memory cells is provided at intersections of a plurality of bit lines and a plurality of word lines and executing refreshing for holding data, comprising:
   memory cells for pairing provided on said memory cell array, for compensating for errors of each memory cell;
   a control circuit for checking a data holding ability of each of memory cells under test in a predetermined period after power-on;
   a storage circuit for storing information which specifies said memory cells under test for which it is determined that said data holding ability is low in the checking of said control circuit; and
   a selecting-line activating circuit for activating a selecting line for pairing corresponding to said memory cells for pairing based on a result of comparing a specific address to be input with the information stored in said storage circuit.

2. A semiconductor storage device according to claim 1, wherein said storage circuit stores respective bits of an address of said memory cell under test for which it is determined that said data holding ability is low in the checking by said control circuit,
   and said selecting-line activating circuit compares said respective bits with the corresponding bits of an input address, and activates said selecting line for pairing when all bits match while does not activate said selecting line for pairing when all bits do not match.

3. A semiconductor storage device according to claim 1, wherein said storage circuit stores information indicating whether said memory cell for pairing is needed,
   and said selecting-line activating circuit activates said selecting line for pairing when said information indicates that said memory cell for pairing is needed while does not activate said selecting line for pairing when said information indicates that said memory cell for pairing is not needed.

4. A semiconductor storage device according to claim 1, wherein said selecting-line activating circuit is configured to activate a column selecting line for pairing,
   and an OR circuit that takes the logical sum of data in two memory cells and outputs a single piece of data when said column selecting line for pairing and corresponding column selecting line are activated by said selecting-line activating circuit is provided.

5. A semiconductor storage device according to claim 1, wherein said selecting-line activating circuit is configured to activate a row selecting line.

6. A semiconductor storage device according to claim 1, further comprising an error correcting circuit including an encoder and a decoder.

7. A semiconductor storage device according to claim 1, wherein said predetermined period is a period before the first entry to a self-refresh mode after power-on.

8. A semiconductor storage device according to claim 1, wherein said predetermined period is an initializing period after power-on.

9. A semiconductor storage device according to claim 1, wherein said memory cell array includes dummy cells for holding data of said memory cells under test on a word-line basis,
   and said control circuit checks said data holding abilities after copying data in said memory cells under test to said dummy cells, stores the test results in said storage circuit, and copies data in said dummy cells back to said memory cells under test.

10. A semiconductor storage device according to claim 1, wherein said control circuit writes checking data that causes memory cells to physically have charges to said memory cells under test connected to a word line for checking said data holding abilities, sequentially reads pieces of said checking data by units of a predetermined number of pieces of data, takes the negative logical product of the data read, and checks said data holding abilities based on said negative logical product.

11. A method of controlling self-refreshing of a semiconductor storage device having a memory cell array in which a plurality of memory cells is provided at intersections of a plurality of bit lines and a plurality of word lines, comprising:
    checking data holding abilities of memory cells under test in a predetermined period after power-on, storing information specifying said memory cells under test for which it is determined that said data holding ability is low,
    and in executing self-refreshing for holding data, comparing an input specific address with said stored information, activating a selecting line for pairing corresponding to comparing results so that memory cells for pairing provided on said memory cell array are selected.

12. A method of controlling self-refreshing of a semiconductor storage device according to claim 11, wherein, said checking of said data holding abilities, comprising:
    copying data in said memory cells under test to dummy cells, self-refreshing said dummy cells, self-refreshing said memory cells under test, and copying data in said dummy cells back to said memory cells under test after said data holding abilities is checked.

13. A method of controlling self-refreshing of a semiconductor storage device according to claim 12, wherein, said dummy cells are self-refreshed by a period that has a sufficient margin with respect to said data holding abilities, and said memory cells under test are self-refreshed by a period that is longer than said self-refreshing period of said dummy cells.

14. A method of controlling self-refreshing of a semiconductor storage device according to claim 13, wherein said self-refreshing period of said dummy cells is approximately 100 ms, and said self-refreshing period of said memory cells under test is approximately 1 second.

* * * * *